(12) United States Patent
Seki et al.

(10) Patent No.: US 10,472,194 B2
(45) Date of Patent: Nov. 12, 2019

(54) CURRENT DETECTING DEVICE, MOTOR CONTROLLING SYSTEM, IMAGE FORMING APPARATUS, SHEET CONVEYING DEVICE, ROBOT, AND CURRENT DETECTING METHOD

(71) Applicants: Takeo Seki, Kanagawa (JP); Haruyuki Suzuki, Kanagawa (JP); Takuya Murata, Tokyo (JP); Hiroyuki Kiguchi, Kanagawa (JP)

(72) Inventors: Takeo Seki, Kanagawa (JP); Haruyuki Suzuki, Kanagawa (JP); Takuya Murata, Tokyo (JP); Hiroyuki Kiguchi, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 270 days.

(21) Appl. No.: 15/397,054

(22) Filed: Jan. 3, 2017

(65) Prior Publication Data
US 2017/0190530 A1    Jul. 6, 2017

(30) Foreign Application Priority Data

Jan. 6, 2016   (JP) ................................. 2016-001164

(51) Int. Cl.
*G01R 15/14* (2006.01)
*B65H 7/20* (2006.01)
(Continued)

(52) U.S. Cl.
CPC ................. *B65H 7/20* (2013.01); *B65H 5/06* (2013.01); *G01R 15/146* (2013.01); *G03G 15/6529* (2013.01); *G03G 15/80* (2013.01); *H02P 6/16* (2013.01); *H02P 6/18* (2013.01); *H02P 6/28* (2016.02); *H04N 1/0032* (2013.01); *H04N 1/00888* (2013.01); *H04N 1/00904* (2013.01);
(Continued)

(58) Field of Classification Search
CPC ............ G01R 15/146; B65H 7/20; H02P 6/28
See application file for complete search history.

(56) References Cited

U.S. PATENT DOCUMENTS

| 2005/0017671 A1* | 1/2005 | Tobari ..................... H02P 6/085 |
|---|---|---|
| | | 318/802 |
| 2006/0024113 A1* | 2/2006 | Saito ................... B41J 13/0027 |
| | | 400/578 |

(Continued)

FOREIGN PATENT DOCUMENTS

| JP | 2001119957 | 4/2001 |
|---|---|---|
| JP | 2011147306 | 7/2011 |

(Continued)

*Primary Examiner* — Giovanni Astacio-Oquendo
*Assistant Examiner* — Alvaro E Fortich
(74) *Attorney, Agent, or Firm* — Harness, Dickey & Pierce, P.L.C.

(57) ABSTRACT

A current detecting device includes: a drive signal generating unit configured to generate a control signal based on a control voltage value indicating drive force to be applied to a target; a current detecting unit configured to detect a current value output based on the control signal generated by the drive signal generating unit; and a correction unit configured to correct the current value detected by the current detecting unit, based on at least a magnitude of the control voltage value.

14 Claims, 15 Drawing Sheets

(51) Int. Cl.
  *B65H 5/06* (2006.01)
  *G03G 15/00* (2006.01)
  *H02P 6/18* (2016.01)
  *H04N 1/00* (2006.01)
  *H02P 6/16* (2016.01)
  *H02P 6/28* (2016.01)
  *G01R 19/00* (2006.01)
  *H02P 27/08* (2006.01)

(52) U.S. Cl.
  CPC ...... *B65H 2403/92* (2013.01); *G01R 19/0092* (2013.01); *G03G 2215/0129* (2013.01); *H02P 27/08* (2013.01); *H04N 2201/001* (2013.01); *H04N 2201/0094* (2013.01)

(56) References Cited

U.S. PATENT DOCUMENTS

| | | | | |
|---|---|---|---|---|
| 2009/0052215 | A1* | 2/2009 | Watanabe | H02M 7/53873 363/131 |
| 2012/0217702 | A1 | 8/2012 | Seki | |
| 2013/0078021 | A1 | 3/2013 | Sakamoto et al. | |
| 2013/0127944 | A1* | 5/2013 | Urban | B41J 2/0057 347/17 |
| 2013/0193894 | A1 | 8/2013 | Kiguchi et al. | |
| 2013/0200836 | A1 | 8/2013 | Ishizuka et al. | |
| 2013/0200838 | A1 | 8/2013 | Seki et al. | |
| 2013/0257341 | A1* | 10/2013 | Suzuki | G05B 21/02 318/636 |
| 2013/0264983 | A1* | 10/2013 | Okumura | H02P 23/22 318/400.26 |
| 2014/0049199 | A1* | 2/2014 | Ishizuka | H02P 6/30 318/400.09 |
| 2014/0079429 | A1* | 3/2014 | Hamaya | G03G 15/80 399/88 |
| 2014/0132189 | A1* | 5/2014 | Kim | G03G 15/55 318/400.13 |
| 2015/0028791 | A1* | 1/2015 | Tsujimoto | H02P 8/12 318/696 |
| 2015/0077027 | A1 | 3/2015 | Seki et al. | |
| 2015/0077028 | A1 | 3/2015 | Seki et al. | |
| 2015/0110525 | A1 | 4/2015 | Sakamoto et al. | |
| 2015/0130385 | A1 | 5/2015 | Ishizuka et al. | |
| 2016/0248360 | A1 | 8/2016 | Seki | |
| 2016/0274152 | A1 | 9/2016 | Seki | |

FOREIGN PATENT DOCUMENTS

| | | |
|---|---|---|
| JP | 2012228155 | 11/2012 |
| JP | 2016158376 | 9/2016 |
| JP | 2016176823 | 10/2016 |

* cited by examiner

CURRENT DETECTING DEVICE, MOTOR CONTROLLING SYSTEM, IMAGE FORMING APPARATUS, SHEET CONVEYING DEVICE, ROBOT, AND CURRENT DETECTING METHOD

CROSS-REFERENCE TO RELATED APPLICATIONS

The present application claims priority under 35 U.S.C. § 119 to Japanese Patent Application No. 2016-001164, filed Jan. 6, 2016. The contents of which are incorporated herein by reference in their entirety.

BACKGROUND OF THE INVENTION

1. Field of the Invention

The present invention relates to a current detecting device, a motor controlling system, an image forming apparatus, a sheet conveying device, a robot, and a current detecting method.

2. Description of the Related Art

Currently known image forming apparatuses employ brushless three-phase direct-current (DC) motors in paper conveying mechanisms or the like. A brushless three-phase DC motor operates with three phases, and therefore three current sensors corresponding to the respective phases are needed in principle in detecting current therethrough. It has been known that use of a current detection approach called the "single-shunt approach" enables current detection in the respective phases with one current sensor (a shunt resistor).

Japanese Unexamined Patent Application Publication No. 2011-147306 discloses a control circuit of an electric motor, the control circuit being configured to correct fluctuations in the value of the voltage across a shunt resistor that have been caused by the influence of the power supply voltage, thereby being capable of accurately detecting current that flows through the one shunt resistor.

However, the control circuit of an electric motor disclosed in Japanese Unexamined Patent Application Publication No. 2011-147306 needs a measurement circuit that directly detects the value of the power supply voltage. The control circuit thus has the disadvantages of having a complicated configuration and consequently being expensive to manufacture.

SUMMARY OF THE INVENTION

A current detecting device includes a drive signal generating unit, a current detecting unit, and a correction unit. The drive signal generating unit is configured to generate a control signal based on a control voltage value indicating drive force to be applied to a target. The current detecting unit is configured to detect a current value output based on the control signal generated by the drive signal generating unit. The correction unit is configured to correct the current value detected by the current detecting unit, based on at least a magnitude of the control voltage value.

BRIEF DESCRIPTION OF THE DRAWINGS

The accompanying drawings are intended to depict exemplary embodiments of the present invention and should not be interpreted to limit the scope thereof. Identical or similar reference numerals designate identical or similar components throughout the various drawings.

DESCRIPTION OF THE EMBODIMENTS

Figure 1:
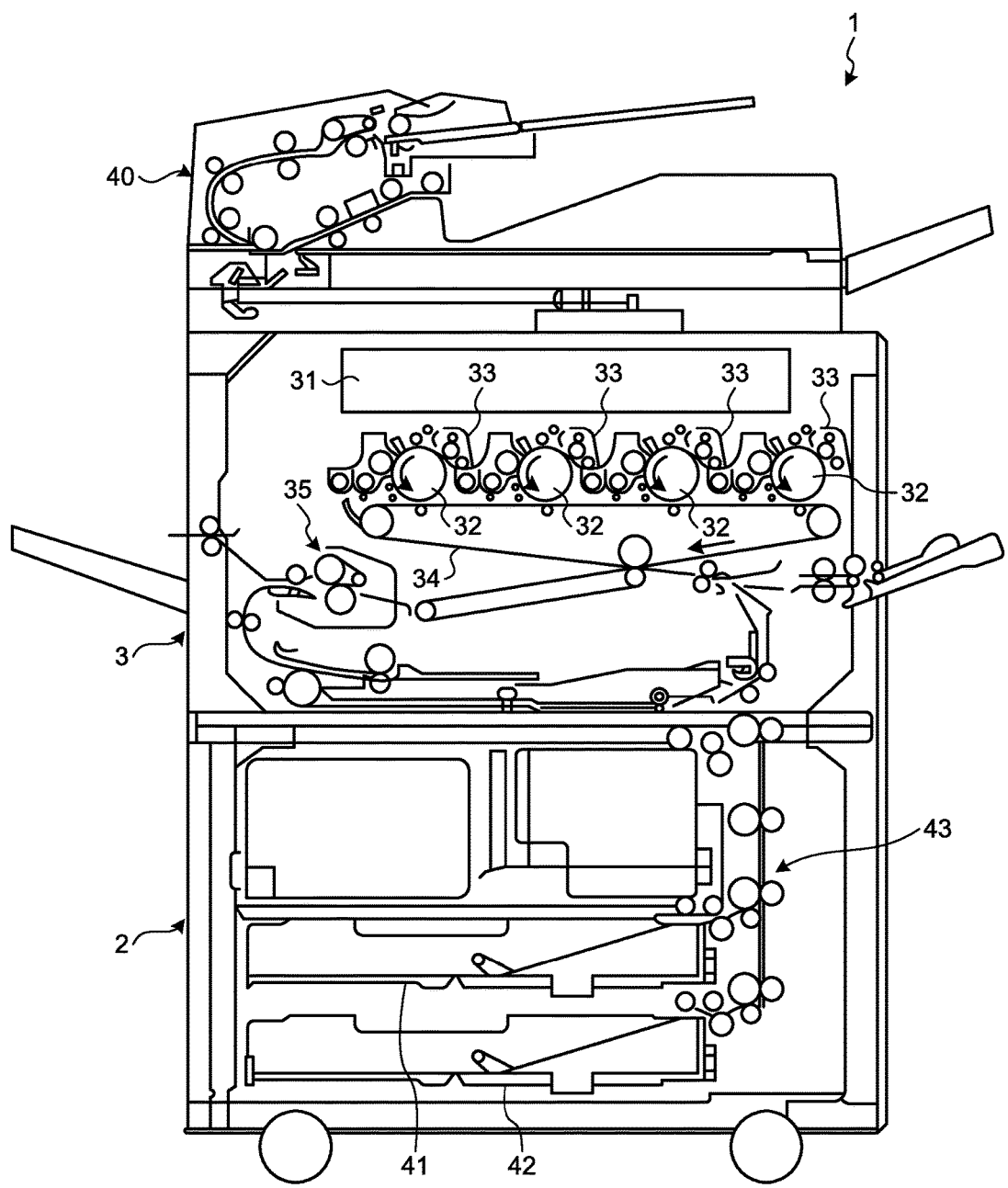
FIG. 1 is a sectional view of a multifunction peripheral according to a first embodiment.

The terminology used herein is for the purpose of describing particular embodiments only and is not intended to be limiting of the present invention.

As used herein, the singular forms "a", "an" and "the" are intended to include the plural forms as well, unless the context clearly indicates otherwise.

In describing preferred embodiments illustrated in the drawings, specific terminology may be employed for the sake of clarity. However, the disclosure of this patent specification is not intended to be limited to the specific terminology so selected, and it is to be understood that each specific element includes all technical equivalents that have the same function, operate in a similar manner, and achieve a similar result.

An embodiment of the present invention will be described in detail below with reference to the drawings.

An embodiment has an object to provide a current detecting device, a motor controlling system, an image forming apparatus, a sheet conveying device, a robot, and a current detecting method that are capable of correcting, with a simplified configuration, unfavorable fluctuations in the value of the voltage across a shunt resistor detected with the single-shunt approach that are caused by fluctuations in power supply voltage.

With reference to the drawings, the following describes an image forming apparatus provided as an embodiment to which the present invention is applied.

First Embodiment

First, a sectional view of a multifunction peripheral 1 according to a first embodiment is illustrated in FIG. 1. This multifunction peripheral 1 provided according to the first embodiment in one example has a copy function, a scanner function, a printer function, and a facsimile function. In addition, the multifunction peripheral 1 includes an auto document feeder (ADF) 40, a paper feeding unit 2, and an image forming unit 3. The paper feeding unit 2 includes: paper feeding cassettes 41 and 42 that contain recording paper of different sheet sizes; and a paper feeder 43 including various rollers that convey recording paper contained in the paper feeding cassettes 41 and 42 to an image formation position in the image forming unit 3.

The image forming unit 3 includes an exposure device 31, a photoconductor drum 32, a developing device 33, a transfer belt 34, and a fixing device 35. The image forming unit 3 causes the exposure device 31 to expose the photoconductor drum 32 to light based on image data of a document read by an image reading unit inside the ADF 40, to form a latent image on the photoconductor drum 32. The image forming unit 3 then causes the developing device 33 to feed toner of different colors to the photoconductor drum 32 and develop the latent image. Thereafter, the image forming unit 3 uses the transfer belt 34 to transfer a developed image formed on the photoconductor drum 32 to recording paper fed from the paper feeding unit 2, and then causes the fixing device 35 to melt the toner of a transferred toner image formed on the recording paper, thereby fixing a color image on the recording paper.

Figure 2:
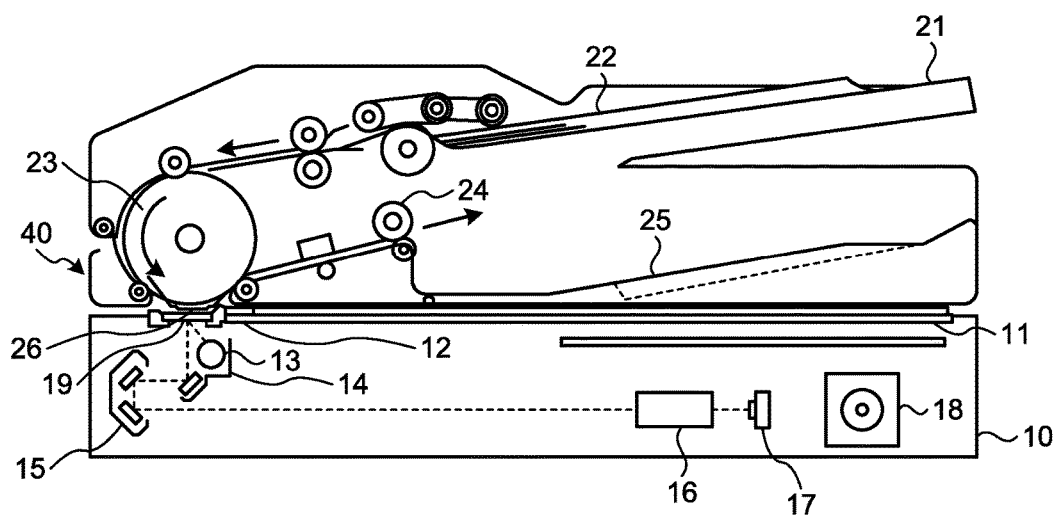
FIG. 2 is an enlarged sectional view of an auto document feeder (ADF) provided in the multifunction peripheral according to the first embodiment.

FIG. 2 is an enlarged sectional view of the ADF 40. The ADF 40 is coupled to the image forming unit 3 with, for example, a hinge member (not illustrated) therebetween so as to be openable and closable. The ADF 40 exposes contact glass 11 when being opened. The ADF 40 covers the entire contact glass 11 when being set closed.

The ADF 40 includes: a document tray 21 on which a bundle of documents including a plurality of documents 22 can be placed; and a conveyance drum 23 that sequentially separates each one of the documents 22 from the others in the bundle of documents placed on the document tray 21 and conveys the each toward the contact glass 11. The ADF 40 stops each of the documents 22 conveyed by the conveyance drum 23 at a reading position on the contact glass 11. The reading unit 10 is provided in a part under the contact glass 11. The reading unit 10 includes a light source 13, a first and a second carriages 14 and 15 each including at least one mirror, a lens 16, a sensor board 17, and a scanner motor 18. The reading unit 10 further includes a reference white plate 12, a read-out window 19, and a background part 26. The reference white plate 12 is a uniform-density member the density of which is uniformed. The reading unit 10 reads the document 22 on the contact glass 11. The paper ejection roller 24 ejects each of the documents 22 onto the paper ejection tray 25 when the reading unit 10 has finished reading the document 22.

More specifically, the conveyance drum 23 is driven by an output signal from a controller. When a paper feeding start signal is provided, the controller not illustrated drives a paper feeding motor to rotate forward or backward that drives the conveyance drum 23 to rotate. When the paper feeding motor is driven to rotate forward, the conveyance drum 23 rotates clockwise, so that the topmost one of the documents 22 is fed from the bundle of documents and conveyed toward the contact glass 11. When the front end of this document 22 is detected by a document-setting detection sensor (not illustrated), the controller, based on a detection signal from the document-setting detection sensor, drives the paper feeding motor to rotate backward. The next one of the documents 22 is thus kept from coming in.

In addition, the controller counts the number of rotation pulses of a conveyance belt motor starting from when the document-setting detection sensor detects the rear end of the document 22. When the number of rotation pulse has reached a certain value, the controller stops driving a feeding belt. The document 22 stops at the reading position on the contact glass 11.

When the document-setting detection sensor detects the rear end of the document 22, the controller drives the paper feeding motor again, thereby conveying the next document 22 toward the contact glass 11. Furthermore, when the number of pulses counted starting from when document-setting detection sensor detects the document 22 has reached a certain number of pulses, the controller stops the paper feeding motor, so that the next one of the documents 22 is kept waiting with its front end coming out forward. Thereafter, when the document 22 has stopped at the reading position on the contact glass 11, the document 22 is exposed to light and read by the reading unit 10. Upon completion of this exposure and reading, the controller drives the conveyance belt motor to rotate forward, thereby causing a conveyance belt to convey the document 22 from the contact glass 11 out to the paper ejection roller 24.

As described above, when a print key on an operation unit is pressed down, documents are fed one by one, sequentially from the topmost one, to a certain position on the contact glass 11 from the bundle of documents that has been placed on the document tray 21 of the ADF 40 with image-carrying surfaces of the documents 22 facing upward. After the reading unit 10 reads image data on the document 22 thus fed on the contact glass 11, the document 22 is ejected onto the paper ejection tray 25 by the feeding belt and the paper ejection roller 24. Furthermore, when the next one of the document 22 is detected on the document tray 21, the thus detected document is fed onto the contact glass 11 in the same manner as the preceding document is fed.

Figure 3:
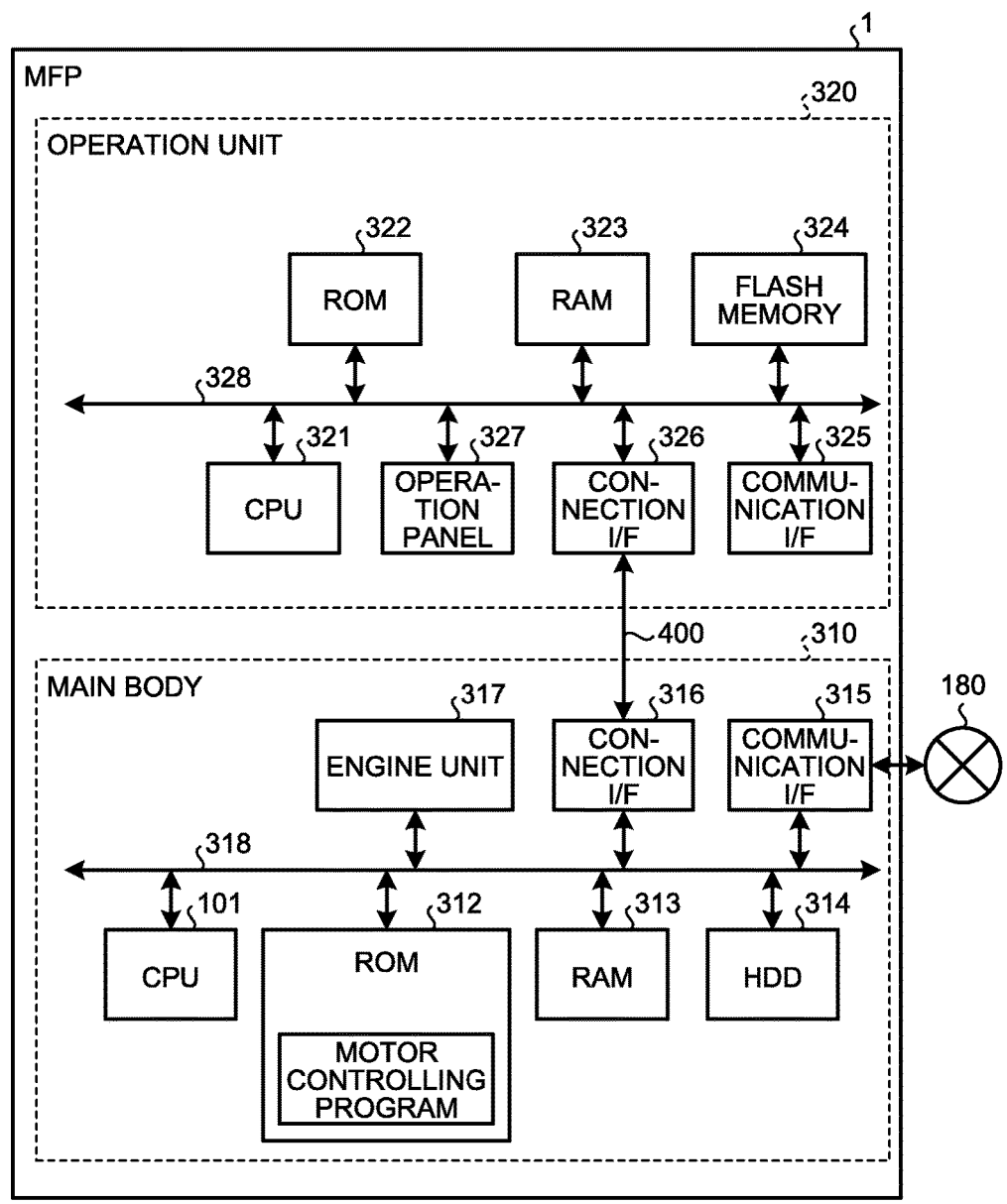
FIG. 3 is a hardware configuration diagram of the multifunction peripheral according to the first embodiment.

FIG. 3 illustrates the hardware configuration of the multifunction peripheral 1. As illustrated in FIG. 3, the multifunction peripheral 1 includes: a main body 310 having various functions such as a copy function, a scanner function, a facsimile function, and a printer function; and an operation unit 320 that receives input corresponding to operations from a user. The main body 310 and the operation unit 320 are connected to each other via a dedicated communication path 400 so as to be able to communicate with each other. The communication path 400 can be implemented using, for example, a device complying with the universal serial bus (USB) standard but may be implemented using a device according to any standard whether the standard is for wired or wireless communications. Furthermore, the main body 310 may have one function from among a copy function, a scanner function, a facsimile function, and a printer function, or may have two or more functions from among these functions.

As the operation unit 320, a piece of electronic equipment capable of independently executing complete information processing can be used. For example, an information processing terminal (a smart device) such as a smartphone or tablet terminal can be used as the operation unit 320. In such a case, the smart device used as the operation unit 320 functions as an operation unit for the multifunction peripheral 1.

That is, the smart device used as the operation unit 320 substitutes for an operation panel that would conventionally have been fixedly installed as an operation unit dedicated to the multifunction peripheral 1, and is connected to the multifunction peripheral 1 while being attachable thereto and detachable therefrom. More specifically, the smart device used as the operation unit 320 is, for example, installed integrally with the multifunction peripheral 1 while being detachable (separable) from a certain position in which an operation panel of the multifunction peripheral 1 is arranged. Consequently, the smart device used as the operation unit 320 and the multifunction peripheral 1 together function as one apparatus. After being detached from the multifunction peripheral 1, the operation unit 320 wirelessly communicates with the multifunction peripheral 1 through, for example, Bluetooth (registered trademark), Wi-Fi (registered trademark) or infrared communication, thereby functioning as the operation unit for the multifunction peripheral 1. In the multifunction peripheral 1, the operation unit 320 is thus provided so as to be detachable from the main body 310 but may be fixedly provided to the main body 310.

The main body 310 operates in accordance with input received by the operation unit 320. In addition, the main body 310 is capable of communicating also with an external apparatus such as a personal computer apparatus, and also operates in accordance with instructions received from the external apparatus.

Next, the hardware configuration of the main body 310 is described. As illustrated in FIG. 3, the main body 310 includes a CPU 101, a read-only memory (ROM) 312, a random-access memory (RAM) 313, and a hard disk drive (HDD) 314. The main body 310 further includes a communication interface (I/F) 315, a connection I/F 316, and an engine unit 17. These components 101 and 312 to 317 are connected to one another via a system bus 318.

The CPU 101 entirely controls the overall operation of main body 310. The CPU 101 executes computer programs stored in storages such as the ROM 312 and the HDD 314 while using the RAM 313 as a work area, thereby controlling the overall operation of the main body 310 and implementing the above-described various functions such as the copy function, the scanner function, the facsimile function, and the printer function.

In the ROM 312, a motor controlling program is stored. Each motor in a main body 10, the scanner motor 18 in the ADF 40, the paper feeding motor, and the conveyance belt motor are examples of a subject to be control by the program, each of which can be implemented using, for example, a brushless three-phase direct current (DC) motor. Rotation of each of these motors is controlled through what is called the "single-shunt approach" in which the rotation is controlled with current of the respective phases detected by one shunt resistor. As described later, a CPU 322 detects current with the single-shunt approach, based on the motor controlling program stored in the ROM 312, thereby being capable of detecting current with the single-shunt approach with high accuracy using a simpler configuration.

The communication I/F 315 is an interface that connects the main body 310 to an external apparatus such as a personal computer apparatus on a network 180. The connection I/F 316 is an interface that connects the main body 310 to the operation unit 320 via the communication path 400. Although FIG. 3 illustrates the communication path 400 as if the communication path 400 is wired, the operation unit 320 is provided so as to be attachable to and detachable from the main body 310 of the multifunction peripheral 1 as described above. It is thus necessary to understood that, while the communication path 400 functions as a wired communication path with the operation unit 320 attached to the multifunction peripheral 1, the communication path 400 functions as a wireless communication path with the operation unit 320 detached from the multifunction peripheral 1.

The engine unit 317 is hardware provided for implementing the copy function, the scanner function, the facsimile function, and the printer function and configured to perform processing other than general-purpose information processing and communication. For example, the engine unit 317 includes units such as a scanner (an image reading unit) to scan and read document images, a plotter (an image forming unit) to perform printing on sheet materials such as a sheet of paper, and a facsimile communication unit to perform facsimile communication.

Next, the hardware configuration of the operation unit 320 is described. As illustrated in FIG. 3, the operation unit 320 includes a CPU 321, a ROM 322, a RAM 323, a flash memory 324, a communication I/F 325, a connection I/F 326, and an operation panel 327, which are connected to one another via a system bus 328.

The CPU 321 entirely controls the overall operation of the operation unit 320. The CPU 321 executes computer programs stored in storages such as the ROM 322 and the flash memory 324 while using the RAM 323 as a work area, to control the overall operation of the operation unit 320.

The communication I/F 325 is an interface for connection to a server apparatus on a network. The connection I/F 326 is an interface that connects the operation unit 320 to the main body 310 via the communication path 400.

The operation panel 327 is constructed of a liquid crystal display device (LCD) including a touch sensor. The operation panel 327 receives various kinds of input that correspond to operations from a user and displays thereon various kinds of information such as information corresponding to the received input, information indicating the operational status of the multifunction peripheral 1, and information indicating the conditions defined in settings. Here, the operation panel 327 may be constructed of an organic electroluminescence (EL) display device including a touch sensor. In addition, the operation panel 327 may be provided with an operation unit constructed of hardware keys and a display unit constructed of a lamp.

Figure 4:
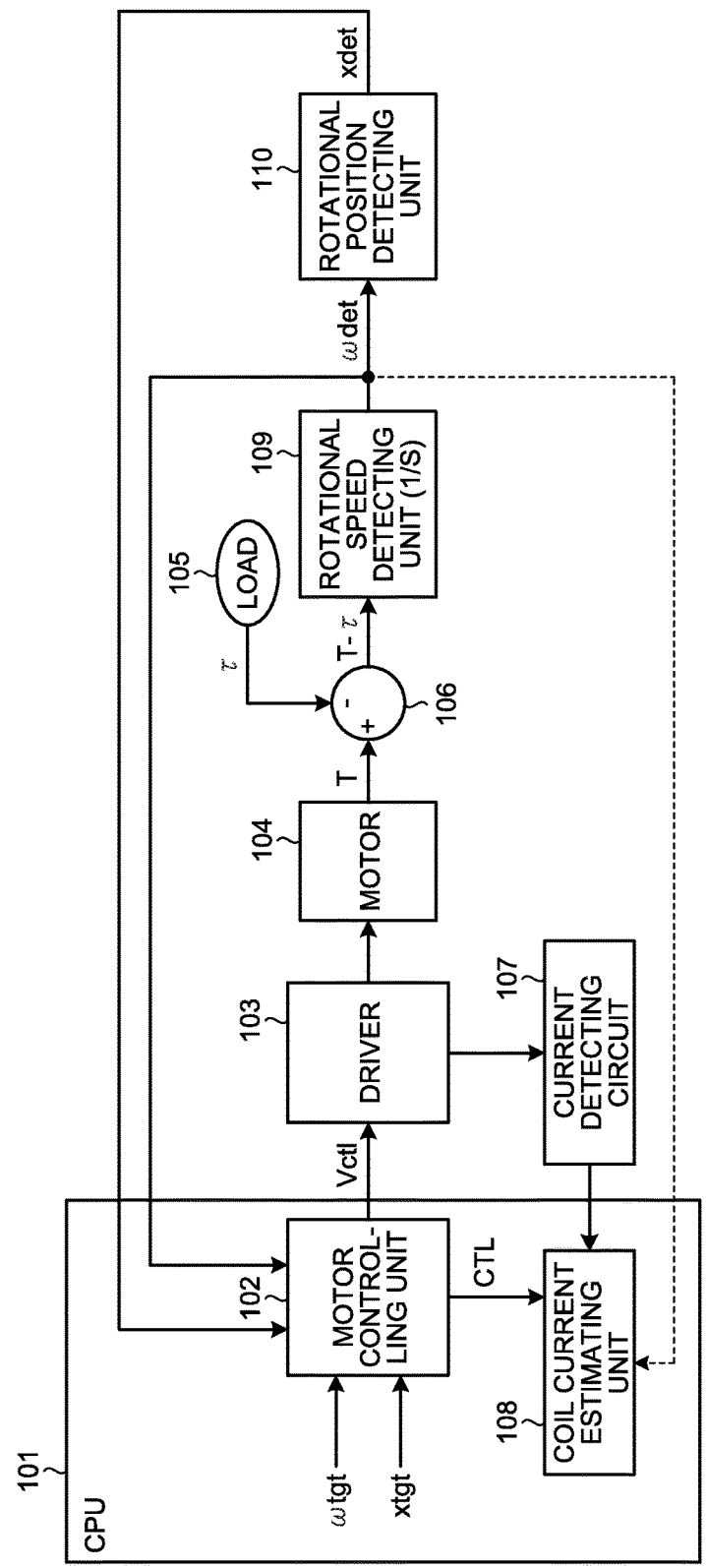
FIG. 4 is a diagram illustrating a rotation controlling unit provided to each motor in the multifunction peripheral according to the first embodiment.

Next, each of the motors such as each motor in the main body 10, the scanner motor 18 in the ADF 40, the paper feeding motor, and the conveyance belt motor is provided with a rotation controlling unit illustrated in FIG. 4. As illustrated in FIG. 4, the rotation controlling unit includes the CPU 101, a driver 103 (an example of a drive signal generating unit), a motor 104, a difference detecting unit 106, a current detecting circuit 107, a rotational speed detecting unit 109, and a rotational position detecting unit 110.

The CPU 101 executes the above-described motor controlling program to implement functions of a motor controlling unit 102 and a coil current estimating unit 108. Here, each of either or both of the motor controlling unit 102 and the coil current estimating unit 108 may be implemented using hardware such as an integrated circuit (IC). In addition, it is assumed that a processor programmed so as to execute functions using software, and a piece of hardware designed so as to execute functions, such as an application specific integrated circuit (ASIC), an IC, or a circuit module, are included as each of the CPUs described herein such as the CPUs 101 and 321.

The motor controlling program may also be recorded as an installable or executable file in a computer-readable recording medium such as a compact disc read only memory (CD-ROM) or a flexible disk (FD) to be provided. The motor controlling program may also be recorded in a computer-readable recording medium such as a compact disc recordable (CD-R), a DVD, a Blu-ray Disc (registered trademark), or a semiconductor memory to be provided. "DVD" stands for "Digital Versatile Disk". The motor controlling program may also be provided via a network such as the Internet. The motor controlling program may also be downloaded via a network and installed in an operation unit 20 (or the main body 10) to be executed. The motor controlling program may also be previously embedded in a ROM or the like inside a device to be provided.

In FIG. 4, the CPU 101 functions as the motor controlling unit 102 and as the coil current estimating unit 108 to perform the operation of controlling a motor and the operation of estimating coil current, respectively. Specifically, the motor controlling unit 102 calculates a control voltage (CTL) for the motor based on input values of a target speed (ωtgt), a target position (xtgt), a detected speed (ωdet), and a detected position (xdet), and supplies the control voltage (CTL) to the coil current estimating unit 108. Furthermore, the motor controlling unit 102 generates a control signal (Vctl) obtained by converting the control voltage (CTL) for the motor into a signal form of a pulse width modulation signal (PWM signal), and supplies the control signal (Vctl) to the driver 103. The motor controlling unit 102 performs, for example, speed feedback control, position feedback control, speed feedforward control, and position feedforward control. The motor controlling unit 102 is configured in this example to generate the control signal (Vctl) obtained by converting the control voltage (CTL) for the motor into a signal form of a pulse width modulation signal (PWM signal), but may be alternatively configured to generate the control signal (Vctl) obtained by converting the control voltage (CTL) into a signal form of a pulse density modulation signal (PDM signal).

The coil current estimating unit 108 calculates an estimated value for coil current in the motor 104 based on the control voltage (CTL) supplied by the motor controlling unit 102 and on a present value of current flowing through the motor 104, which is detected by the current detecting circuit 107 and is represented by the potential difference between the opposite ends of a shunt resistor provided in the driver 103.

Based on the control signal (Vctl) that is a PWM signal supplied by the motor controlling unit 102, the driver 103 performs switching processing for driving the motor 104. The motor 104 is driven to rotate as a result of this processing, so that torque (T) is generated. The difference detecting unit 106 calculates the difference (T−τ) between the torque (T) generated by the motor 104 and load torque (τ) generated when the motor 104 drives a load 105 such as the conveyance belt. The rotational speed detecting unit 109 calculates the rotational speed (ωdet) of the motor 104 based on the above-described difference (T−τ). The rotational position detecting unit 110 calculates the rotational position (xdet) of the motor 104 based on the rotational speed (ωdet) calculated by the rotational speed detecting unit 109. A frequency generator (FG) sensor, a two-phase encoder, or the like can be used as the rotational speed detecting unit 109 and the rotational position detecting unit 110.

To the CPU 101, signals corresponding to the rotational speed (ωdet) calculated by the rotational speed detecting unit 109, the rotational position (xdet) calculated by the rotational position detecting unit 110, the target speed (ωtgt), and the target position (xtgt) are supplied. By functioning as the motor controlling unit 102, the CPU 101 not only calculates the control voltage (CTL) for the motor but also generates a control signal (Vctl) obtained by converting the control voltage (CTL) for the motor into a signal form of a pulse width modulation signal (PWM signal) and supplies the control signal (Vctl) to the driver 103.

The current detecting circuit 107 detects, as a current value indicating the amount of current presently flowing through the motor 104, the potential difference between the opposite ends of a shunt resistor Rf provided to the driver 103. The current detecting circuit 107 then supplies a current detection signal indicating the detected current value to the CPU 101. The current detecting circuit 107 and the shunt resistor Rf are provided as an example of a current detecting unit. By functioning as the coil current estimating unit 108, the CPU 101 corrects, using the control voltage (CTL) supplied by the motor controlling unit 102, fluctuations caused in the current detection signal supplied by the current detecting unit 107 by the power supply voltage.

Figure 5:
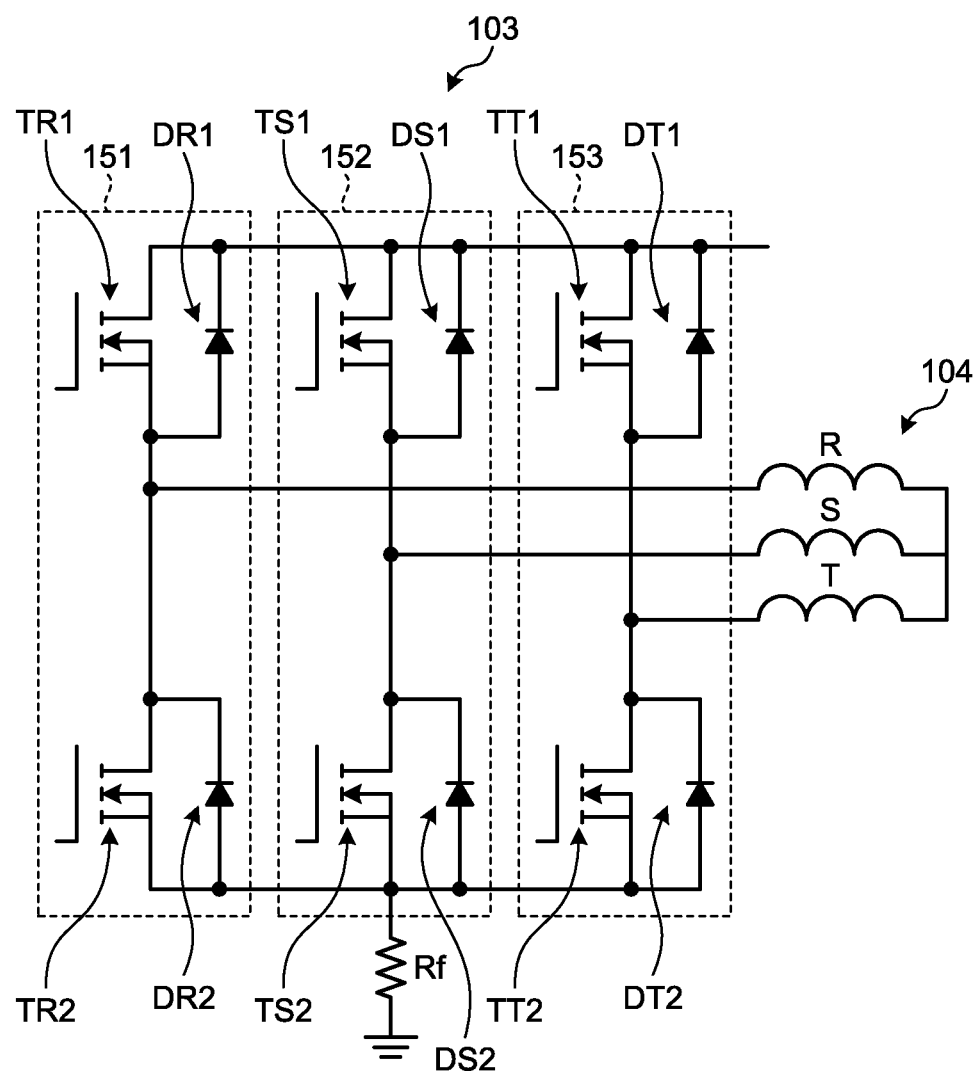
FIG. 5 is a circuit diagram of a driver for the motor provided in the multifunction peripheral according to the first embodiment.

FIG. 5 illustrates a circuit diagram of the driver 103. Although being an example, the driver 103 is constructed as what is called a three-phase switching circuit, which controls switching of the respective phases of the motor 104, as illustrated in FIG. 5. As illustrated in FIG. 5, the driver 103 includes a first arm 151 that controls switching of the first phase (R) of the motor 104, a second arm 152 that controls switching of the second phase (S) of the motor 104, and a third arm 153 that controls switching of the third phase (T) of the motor 104.

Each of the arms 151 to 153 includes a pair of switching elements TR1 and TR2, a pair of switching elements TS1 and TS2, and a pair of switching elements TT1 and TT2, the respective pairs being configured to control switching of the corresponding phases. For example, a metal-oxide-semiconductor field-effect transistor (MOSFET) or an insulated gate bipolar transistor (IGBT) can be used as each of the switching elements. The respective switching elements are provided with reflux diodes DR1 and DR2 connected in parallel to each other, the reflux diodes DS1 and DS2 connected in parallel to each other, and the reflux diodes DT1 and DT2 connected in parallel to each other. Each of these reflux diodes has a polarity such that current flows back into a direct-current power supply. The shunt resistor Rf is inserted between and connected in series to the three-phase switching circuit thus configured and the ground.

Next, a shunt resistor end-to-end voltage signal, which occurs between the opposite ends of the shunt resistor Rf, is described. A shunt resistor end-to-end voltage signal is a signal of the voltage across the shunt resistor Rf through which combined current flows in the driver 103 (see FIG. 5) described above. The shunt resistor Rf is a resistor conventionally provided so that the driver 103 side can generate a shunt resistor end-to-end voltage signal and enable a current limiting function. The shunt resistor Rf is thus not a component newly provided to the driver 103.

Figure 6:
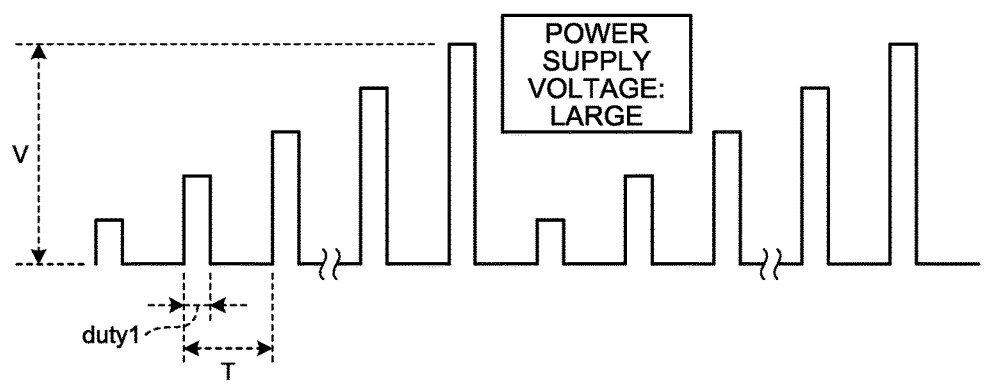
FIG. 6 is a waveform diagram of a signal of the voltage across a shunt resistor that is detected by a current detecting circuit when the power supply voltage is large under conditions of a certain rotational speed and a certain load.
Figure 7:
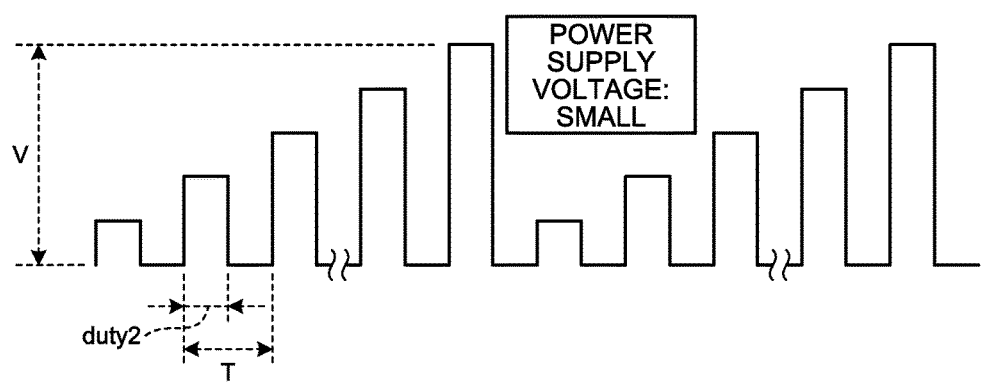
FIG. 7 is a waveform diagram of a signal of the voltage across the shunt resistor detected by the current detecting circuit when the power supply voltage is small subject to the same conditions as in FIG. 6 (of the certain rotational speed and the certain load)

FIG. 6 is a waveform diagram of a shunt resistor end-to-end voltage signal detected by the current detecting circuit 107 when the power supply voltage is large under conditions of a certain rotational speed and a certain load. FIG. 7 is a waveform diagram of a shunt resistor end-to-end voltage signal that is detected by the current detecting circuit 107 when the power supply voltage is small under the same conditions as in FIG. 6 (of the certain rotational speed and the certain load). "T" in FIG. 6 and FIG. 7 denotes a PWM period of the control signal (Vctl) converted into a signal form of a pulse width modulation signal (PWM signal) and supplied to the driver 103 by the motor controlling unit 102. The PWM period of the control signal (Vctl) is not affected by the power supply voltage.

"V" in FIG. 6 and FIG. 7 denotes the amplitude of voltage value of the shunt resistor end-to-end voltage signal detected by the current detecting circuit 107. A voltage value of the shunt resistor end-to-end voltage signal is determined according to the magnitude of the load torque τ acting on the load 105. The voltage value of the shunt resistor end-to-end voltage signal is also not affected by the power supply voltage.

In contrast, "duty (equal to the pulse width)" in FIG. 6 and FIG. 7 is a control voltage calculated using an arithmetic expression "duty (%)×power supply voltage" for controlling the rotational speed of the motor 104. When the power supply voltage is large, the control voltage has "low duty" as illustrated in FIG. 6. In contrast, when the power supply voltage is small, the control voltage has "high duty" as illustrated in FIG. 7. The "duty" of the control voltage is affected by the magnitude (fluctuation) of the power supply voltage.

Figure 8:
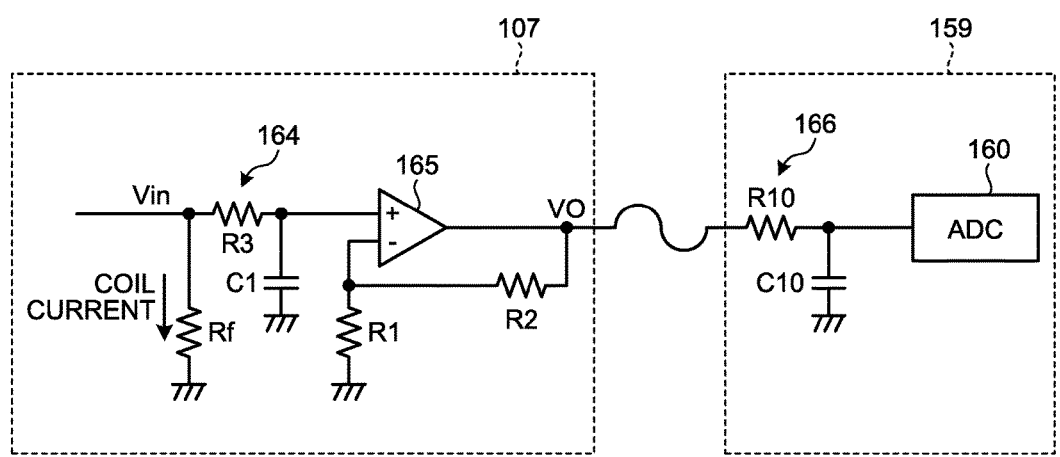
FIG. 8 is a circuit diagram of a current detecting circuit provided on the motor substrate side and an input processing circuit provided on the main substrate side, in the multifunction peripheral according to the first embodiment.

FIG. 8 illustrates: a circuit diagram of the current detecting circuit 107 provided on the motor substrate side of the motor 104; and a circuit diagram of an input processing circuit 159 provided on the main substrate side on which the CPU 101 is provided. As illustrated in FIG. 8, the current detecting circuit 107 includes: a smoothing circuit 164 (an example of a smoothing unit) configured as a low-pass filter; and a non-inverting amplifier circuit 165. The smoothing circuit 164 is formed with a capacitor C1 inserted between and connected to the ground and an interconnection between the output terminal of a resistor R3 and the non-inverting input terminal (+) of the non-inverting amplifier circuit 165. The non-inverting amplifier circuit 165 has a negative feedback configuration. The input processing circuit 159 provided on the main substrate side includes a smoothing circuit 166 and an analog to digital converter (ADC) 160. The smoothing circuit 166 includes: a resistor R10; and a capacitor C10 inserted between and connected to the output terminal of the resistor R10 and the ground.

In FIG. 8, the current detecting circuit 107 causes the smoothing circuit 164 to smooth the shunt resistor end-to-end voltage signal (Vin), which contains ripple components, and then causes the non-inverting amplifier circuit 165 to amplify the thus smoothed voltage signal with an amplification rate determined by an arithmetic operation "1+(R1+R2)". The input processing circuit 159 performs further smoothing processing on the shunt resistor end-to-end voltage signal (Vin) supplied by the non-inverting amplifier circuit 165 so as to remove the ripple components remaining therein, and supplies the shunt resistor end-to-end voltage signal (Vin) to the ADC 160. The ADC 160 digitalizes the shunt resistor end-to-end voltage signal (Vin) that has been smoothed with the ripple components removed twice therefrom. As described later, by functioning as the coil current estimating unit 108, the CPU 101 corrects fluctuations caused in the digitalized shunt resistor end-to-end voltage signal (Vin) by the influence of the power supply voltage.

Here, the smoothing circuit 164 and the smoothing circuit 166 may be omitted when a CPU capable of executing, at high speed, processing (to be described later) for correcting fluctuations caused in shunt resistor end-to-end voltage signal (Vin) by the influence of the power supply voltage is employed as the CPU 101. In addition, the shunt resistor end-to-end voltage signal (Vin) is smoothed by the smoothing circuit 164 and the smoothing circuit 166, which are capacitor-resistor (CR) circuits in this example, but may be smoothed through moving-average processing performed by the ADC 160. When the ADC 160 performs the moving-average processing, the average of a present value of the shunt resistor end-to-end voltage signal (Vin) and some values of the shunt resistor end-to-end voltage signal (Vin) that are obtained by delaying in units of samples is calculated. The ripple components can be averaged and removed through this processing, which means that the smoothing circuit 164 and the smoothing circuit 166 can be omitted.

Figure 9:
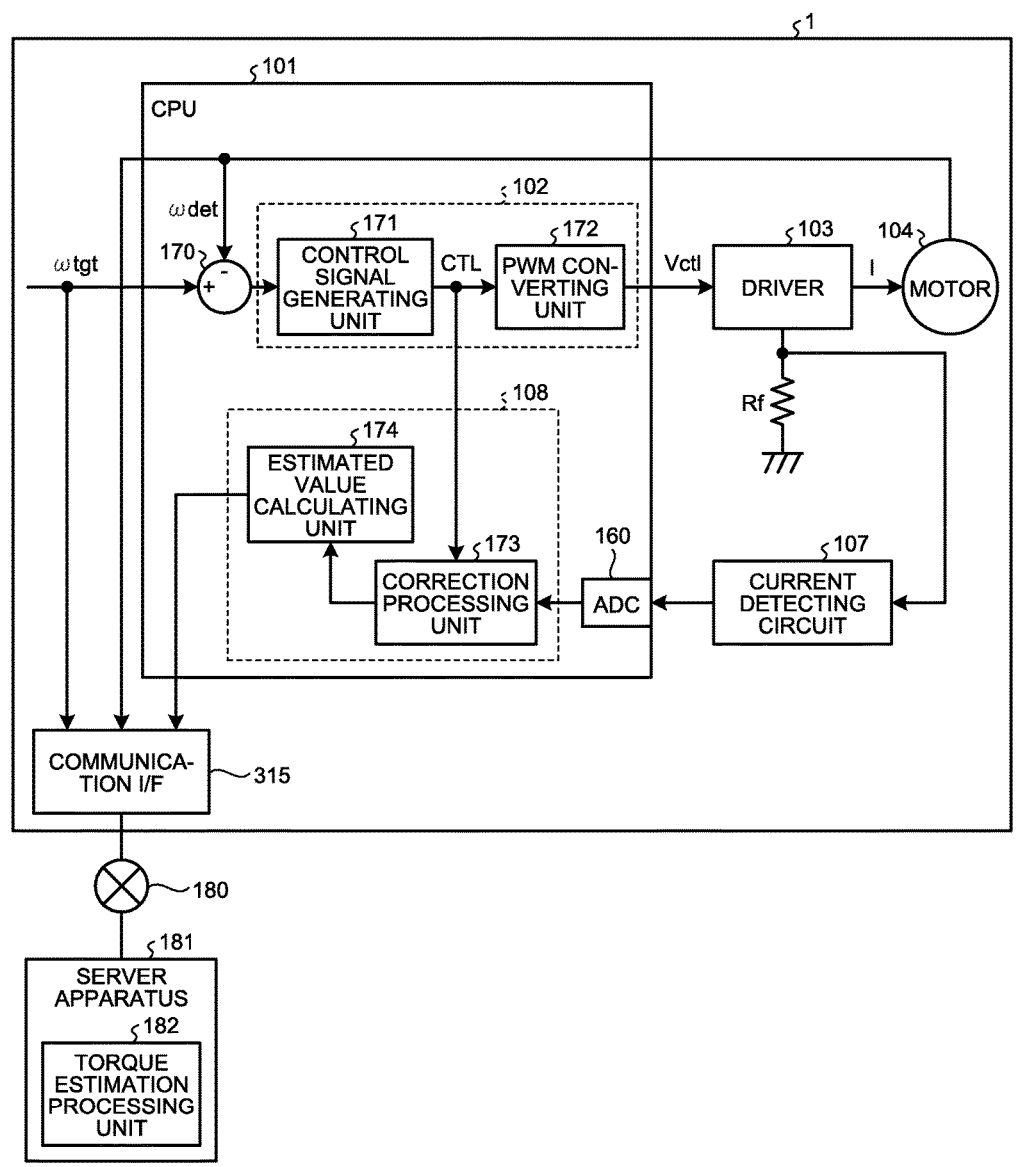
FIG. 9 is a detailed functional block diagram of a central processing unit (CPU) in the multifunction peripheral according to the first embodiment.

FIG. 9 illustrates a detailed functional block diagram of the CPU 101. With reference to FIG. 9, operation for processing for correcting fluctuations caused in shunt resistor end-to-end voltage signal (Vin) by the influence of the power supply voltage is described. First, a difference detecting unit 170 in the CPU 101 detects the difference between the target speed (ωtgt), which is a rotational speed that the motor 104 is intended to have, and a present rotational speed (ωdet) of the motor calculated by the rotational speed detecting unit 109, and supplies the difference to the motor controlling unit 102.

The motor controlling unit 102 includes a control signal generating unit 171 and a PWM converting unit 172. The control signal generating unit 171 generates a control signal (CTL) of a voltage value that corrects the difference between the target speed (ωtgt) and the present rotational speed (ωdet) of the motor 104, and supplies the control signal (CTL) to the PWM converting unit 172 and a correction processing unit 173 in the coil current estimating unit 108. The PWM converting unit 172 generates a control signal (Vctl) obtained by performing pulse width modulation processing (PWM processing) on the control signal (CTL), and supplies the control signal (Vctl) to the driver 103. The driver 103 drives, with current the current amount of which corresponds to the control signal (Vctl), the motor 104 to rotate. The rotational speed (ωdet) of the motor is detected by the rotational speed detecting unit 109 illustrated in FIG. 4, and is negative fed back to the difference detecting unit 170.

At the same time, the current amount corresponding to the control signal (Vctl) supplied by the driver 103 to the motor 104 is detected as a voltage value by the shunt resistor Rf. The current detecting circuit 107 smoothes, in the manner described with reference to FIG. 8, the shunt resistor endto-end voltage signal (Vin), which is a voltage value that has been detected by the shunt resistor Rf and that corresponds to the present current amount flowing through the motor 104. The smoothed shunt resistor end-to-end voltage signal (Vin) is digitalized by the ADC 160 and then supplied to the correction processing unit 173 of the coil current estimating unit 108.

The correction processing unit 173 performs correction processing on the shunt resistor end-to-end voltage signal (Vin), using the control signal (CTL) of a voltage value for correcting the difference between the target speed ($\omega$tgt) and the present rotational speed ($\omega$det) of the motor 104. That is, the correction processing unit 173 is provided as an example of a correction unit. The correction processing unit 173 calculates "i (A)", which is coil current flowing through the motor 104, using an arithmetic expression "i=Tf/Kt" with "Tf (Nm)" denoting the torque acting on the load 105 and "Kt (Nm/A)" denoting a torque constant.

In addition, the average "Vdet (V)" of the voltage across the shunt resistor is expressed as "Vdet=i×Rdet×(CTL/24) =(Tf/Kt)×Rdet×(CTL/24)", with Rdet ($\Omega$) denoting the resistance value of the shunt resistor Rf and "CTL (V)" denoting a voltage value for the control signal. The correction processing unit 173 performs an arithmetic operation of "CTL/24=dt/T" with: "dt" denoting the pulse width of the control signal (Vctl) converted into a signal form of a PWM signal by the PWM converting unit 172; and "T" denoting a PWM period, to calculate (detects) the duty value of the control signal (CTL). The correction processing unit 173 then multiplies an expression "Vdet=(Tf/Kt)×Rdet×(dt/T)" by "the inverse of dt/T", thereby calculating a corrected value "Vdet2" in which fluctuations caused in the average "Vdet (V)" of the voltage across the shunt resistor by the influence of the power supply voltage are corrected.

$$Vdet2=(Tf/Kt)\times Rdet\times T/dt$$

The estimated value calculating unit 174 in the coil current estimating unit 108 performs the following calculation based on the corrected average "Vdet2" of the voltage across the shunt resistor, to calculate an estimated value "i" of the present coil current in the motor 104.

$$i=Vdet2/Rdet$$

The estimated value "i" of the coil current is supplied to the communication I/F and transmitted together with the target speed ($\omega$tgt) of the motor 104 or the detected speed ($\omega$det) of the motor 104 to a server apparatus 181 via a network 180.

The server apparatus 181 acquires, from each of the multifunction peripherals 1 connected thereto via the network 180, the above-described estimated value "i" of the coil current together with the target speed ($\omega$tgt) of the motor 104 or the detected speed ($\omega$det) of the motor 104. The torque estimation processing unit 182 of the server apparatus 181 estimates (calculates), using the estimated value "i" of the coil current and the target speed ($\omega$tgt) of the motor 104 (or the detected speed ($\omega$det) of the motor 104) that have been acquired from each of the multifunction peripherals 1, a torque acting on the load 105 (illustrated in FIG. 4) in each of the multifunction peripherals 1 and monitors the present state of the load 105 in each of the multifunction peripherals 1.

Here, although the server apparatus 181 is configured to estimate (calculate) torque acting on the load 105, the CPU 101 of the multifunction peripheral 1 may estimate (calculate) the torque. However, when the server apparatus 181 estimates (calculates) the torque, the burden of calculation and the burden of monitoring the load 105 are reduced on the part of the CPU 101 of the multifunction peripheral 1. Alternatively, the CPU 101 of the multifunction peripheral 1 may be configured to calculate an estimated value of the torque acting on the load 105 and transmit the estimated value to the server apparatus 181. In such a case, the server apparatus 1 monitors the load 105 in each of the multifunction peripherals 1 based on the estimated value transmitted from each of the multifunction peripherals.

The server apparatus 181 may be further configured to perform the above-described correction processing for the average "Vdet2" of the voltage across the shunt resistor and calculation processing for the estimated value "i" for the present coil current in the motor 104 with the multifunction peripheral 1 while being configured to transmit the detected speed ($\omega$det) of the motor 104, the value (ADC value) obtained by digitalizing the value of the voltage across the shunt resistor, the control signal (Vctl) generated by the control signal generating unit 171, the resistance value of the shunt resistor Rf, and the amplification factor of the non-inverting amplifier circuit 165 in the current detecting circuit 107 to the server apparatus 181. In such a case, a burden that would otherwise be placed on the CPU 101 for such calculation processing can be additionally reduced.

Figure 10:
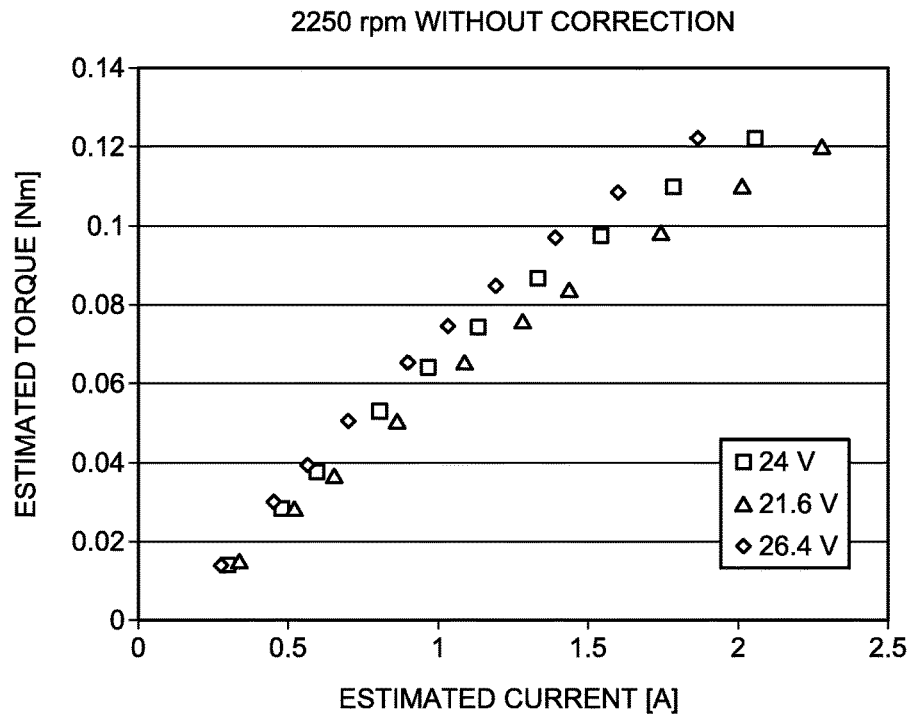
FIG. 10 is a diagram illustrating the estimated value (the horizontal axis) of coil current in the motor and the measurement result of load torque (the vertical axis) acting on a load when fluctuations caused in the average "Vdet (V)" of voltage across a shunt resistor were not corrected in the multifunction peripheral according to the first embodiment.
Figure 11:
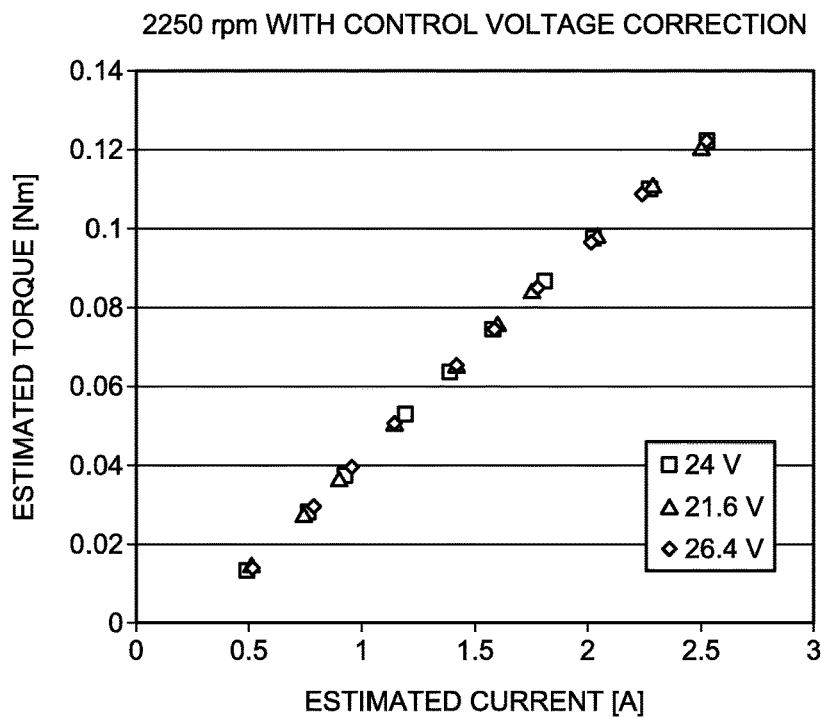
FIG. 11 is a diagram illustrating the estimated value (the horizontal axis) of coil current in the motor and the measurement result of load torque (the vertical axis) acting on the load when fluctuations caused in the average "Vdet (V)" of voltages across a shunt resistor were corrected in the multifunction peripheral according to the first embodiment.

FIG. 10 and FIG. 11 are diagrams illustrating the estimated value (the horizontal axis) of the present coil current in the motor 104 and the measurement result of load torque (the vertical axis) acting on the load 105, the estimated value and the measurement result having been measured with the power supply voltage varied (dispersed) in the range of 24 V±10%. Of these diagrams, FIG. 10 is a diagram illustrating the estimated value (the horizontal axis) of the present coil current in the motor 104 and the measurement result of load torque (the vertical axis) acting on the load 105 when fluctuations caused in the average "Vdet (V)" of the voltage across the shunt resistor were not corrected. In contrast, FIG. 11 is a diagram illustrating the estimated value (the horizontal axis) of the present coil current in the motor 104 and the measurement result of load torque (the vertical axis) acting on the load 105 when fluctuations caused in the average "Vdet (V)" of the voltage across the shunt resistor were corrected. In both of these cases, the number of rotations of the motor 104 was set to a constant number of rotations, 2250 rpm.

The power supply voltage was changed from 24 V to 21.6 V (−10%), and then to 26.4 V (−10%). In FIG. 10 and FIG. 11, points indicated as hollow circles correspond to estimated values of coil current and measured values of load torque acting on the load 105 with the power supply voltage set to 24 V. In FIG. 10 and FIG. 11, points indicated as hollow triangles correspond to estimated values of coil current and measured values of load torque acting on the load 105 with the power supply voltage set to 21.6 V (−10%). In FIG. 10 and FIG. 11, points indicated as hollow squares correspond to estimated values of coil current and measured values of load torque acting on the load 105 with the power supply voltage set to 26.4 V (+10%).

It can be seen that, when fluctuations caused in the average "Vdet (V)" of the voltage across the shunt resistor were not corrected, there were fluctuations in point corresponding to each estimated value of the coil current and each measured value of the load torque acting on the load 105 for the respective power supply voltages were varied as illustrated in FIG. 10. It can be seen that, in contrast, when fluctuations caused in the average "Vdet (V)" of the voltage across the shunt resistor were corrected, fluctuations in point corresponding to each estimated value of the coil current and each measured value of the load torque acting on the load 105 for the respective power supply voltages were corrected as illustrated in FIG. 11.

It can also be seen that, while graphs in FIG. 10 are non-linear, graphs in FIG. 11 are almost linear. The torque "Tf (Nm)" acting on the load 105 can be calculated using an arithmetic expression "Tf=Vdet 2×(Kt/Rdet)". This arithmetic expression indicates that the load torque and the estimated current can be expressed as linear functions without influence from a back electromotive component and that a burden on the CPU 101 due to software-based processing is small (which are results as the theory "torque=torque constant×current" goes).

Figure 12:
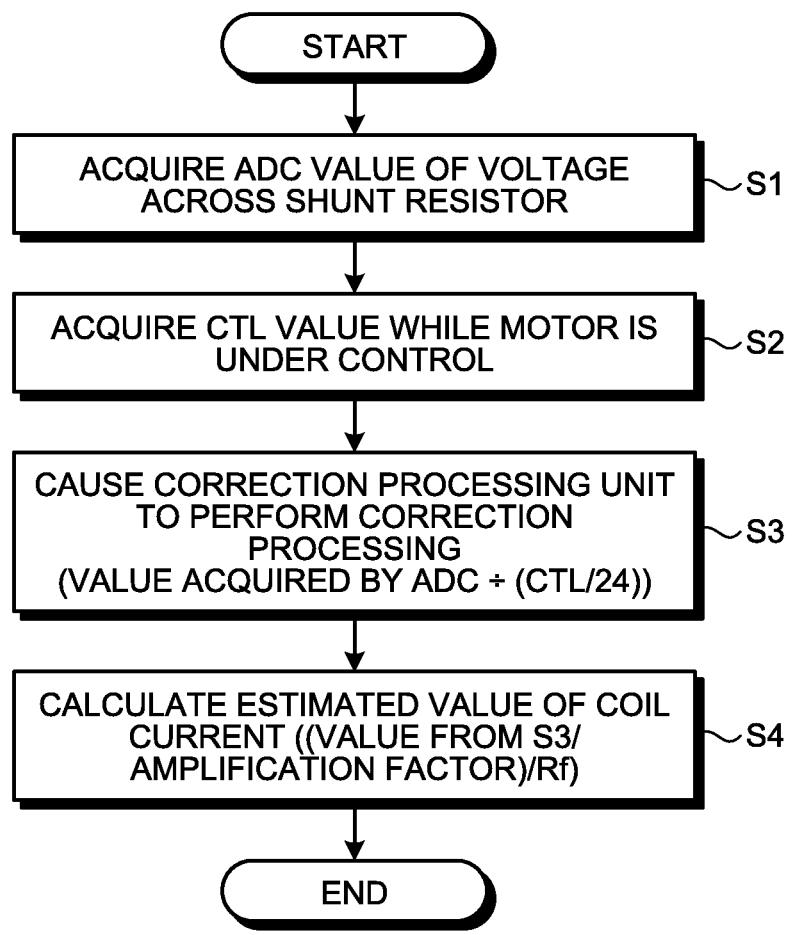
FIG. 12 is a flowchart illustrating the procedure of operation to be performed in the multifunction peripheral according to the first embodiment, so that fluctuations caused in voltage across a shunt resistor by the influence of the power supply voltage are corrected and an estimated value of coil current in a motor is calculated.

Next described with reference to a flowchart in FIG. 12 is the procedure of operation to be performed when the CPU 101 executes the motor controlling program stored in the ROM 12, so that fluctuations caused in the voltage across the shunt resistor by the influence of the power supply voltage are corrected and an estimated value of coil current in the motor 104 is calculated.

First, at Step S1, the correction processing unit 173 in the CPU 101 acquires the average of the voltage across the shunt resistor Rf detected by the current detecting circuit 107 and digitalized by the ADC 160. At Step S2, the correction processing unit 173 acquires the control signal (CTL) for the motor 104 generated by the control signal generating unit 171.

At Step S3, the correction processing unit 173 calculates the average "Vdet (V)" of the voltage across the shunt resistor in the above-described manner with "i (A)" denoting coil current in the motor 104, "Rdet (Ω)" denoting the resistance value of the shunt resistor Rf, and "CTL (V)" denoting a voltage value from the control signal.

$$Vdet=i\times Rdet\times(CTL/24)=(Tf/Kt)\times Rdet\times(CTL/24).$$

"CTL/24=dt/T" holds with "dt" denoting the pulse width of the control signal (Vctl) obtained through conversion by the PWM converting unit 172 into a signal form of a PWM signal, and "T" denoting the PWM period; therefore, the correction processing unit 173 multiplies the expression "Vdet=(Tf/Kt)×Rdet×(dt/T)" by "the inverse of dt/T", thereby calculating a corrected value "Vdet2" in which fluctuations caused in the average "Vdet (V)" of the voltage across the shunt resistor by the influence of the power supply voltage.

$$Vdet2=(Tf/Kt)\times Rdet\times T/dt$$

At Step S4, the estimated value calculating unit 174 performs the following calculation based on the corrected average "Vdet2" of the voltage across the shunt resistor, to calculate an estimated value "i" of the present coil current in the motor 104, and the processing of the flowchart in FIG. 12 is thus ended.

$$i=Vdet2/Rdet$$

Here, the estimated value "i" of the coil current in the motor 104 may be calculated by performing an arithmetic operation of "i=Vdet2/(Rdet×a)", where: "a" denotes the amplification factor of the non-inverting amplifier circuit 165 in the current detecting circuit 107 illustrated in FIG. 8; and "Rdet" denotes the resistance value of the shunt resistor Rf.

The estimated value "i" of the coil current is supplied to the communication I/F and, as described above, transmitted together with the target speed (ωtgt) of the motor 104 or the detected speed (ωdet) of the motor 104 to the server apparatus 181 via the network 180.

As is obvious from the above description, the multifunction peripheral 1 according to the first embodiment detects the voltage across the shunt resistor Rf provided to the driver 103 that drives the motor 104 to rotate. The multifunction peripheral 1 then corrects the voltage across the shunt resistor using a control signal for driving the motor 104 to rotate, that is, corrects the voltage across the shunt resistor using the duty value of a correction signal supplied by the driver 103 to the motor 104.

Variations caused in the voltage across the shunt resistor in a single-shunt resistor Rf because of fluctuations in power supply voltage are thus corrected without a dedicated circuit provided for measuring the power supply voltage, and highly accurate voltage across the shunt resistor can be obtained as a consequence. This embodiment can be implemented in the form of software-based correction processing without a dedicated circuit provided for measuring the power supply voltage, and thus can be implemented with a simple configuration and inexpensively. In addition, an accurate value of coil current with which the motor 104 is driven to rotate can be calculated based on the corrected voltage across the shunt resistor. The calculated coil current is thus accurate, so that a load being driven by the motor 104 can be also calculated accurately; thus this embodiment can be accurately implemented for such a purpose as monitoring of the load.

Second Embodiment

Next, a multifunction peripheral according to a second embodiment is described. The multifunction peripheral 1 according to the above-described first embodiment is an example in which the correction processing unit 173 corrects the voltage across the shunt resistor using the control signal (CTL) from the control signal generating unit 171, and calculates the coil current "i" in the motor 104 using the corrected voltage across the shunt resistor and the resistance value "Rdet" of the shunt resistor Rf. In contrast, the multifunction peripheral according to the second embodiment is an example in which, while the voltage across the shunt resistor is corrected using the pulse width of a control signal (Vctl) converted into a signal form of a pulse width modulation signal (PWM signal) by the PWM converting unit 172, the coil current "i" is calculated. This is the only difference between the above-described first embodiment and the second embodiment described hereinbelow. The following thus describes only the difference, in which redundant description is omitted.

Figure 13:
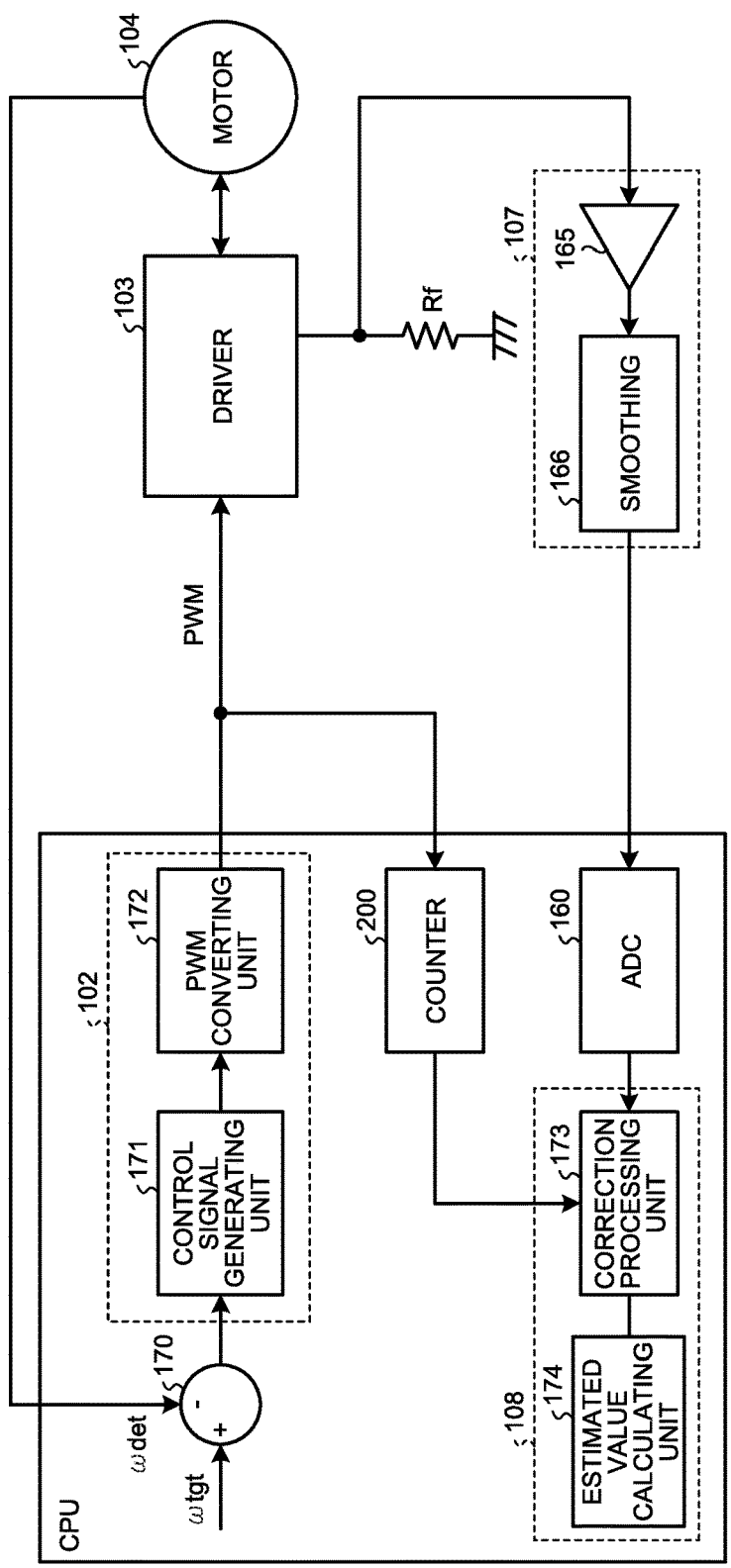
FIG. 13 is a diagram illustrating the configuration of the main part of a multifunction peripheral according to a second embodiment.

FIG. 13 illustrates the configuration of the main part of the multifunction peripheral according to the second embodiment. As illustrated in FIG. 13, the multifunction peripheral according to the second embodiment includes a counter 200 that counts (measures) the pulse width of the control signal (Vctl) obtained by converting the control signal (CTL) supplied from the control signal generating unit 171 into a signal form of a pulse width modulation signal (PWM signal), and supplies a resultant count value (measured value) to the correction processing unit 173.

The correction processing unit 173 corrects the voltage across the shunt resistor using the count value indicating the pulse width of the control signal (Vctl), and calculates the coil current "i" in the motor 104. More specifically, the correction processing unit 173 uses: "a" denoting the amplification factor of the non-inverting amplifier circuit 165 in the current detecting circuit 107; "f" denoting the clock source frequency of the counter 200; "t" denoting the count value (=the pulse width) of the counter 200; "V2" denoting the value (=the output of the ADC 160) of a voltage across the shunt resistor; and "T" denoting the PWM period of the control signal (Vctl) converted into a signal form of a pulse width modulation signal (PWM signal). The correction processing unit 173 then performs an arithmetic operation of "i=(V2/a)×((t/f)/T)", thereby calculating the coil current "i" in the motor 104.

This configuration makes it possible to accurately correct the voltage across the shunt resistor and obtain accurate coil current with a simple configuration and inexpensively without a dedicated circuit provided for measuring the power supply voltage, and also makes it possible to provide the same effects as in the above-described first embodiment.

Third Embodiment

Next, a multifunction peripheral according to a third embodiment is described. The multifunction peripheral 1 according to the second embodiment is an example in which the correction processing unit 173 corrects the voltage across the shunt resistor using the pulse width of a control signal (Vctl) converted into a signal form of a pulse width modulation signal (PWM signal) and calculates the coil current "i". In contrast, the third embodiment is an example in which: averaging processing is performed on a control signal (Vctl) converted into a signal form of a pulse width modulation signal (PWM signal); the voltage across the shunt resistor is then corrected using the control signal on which averaging processing has been performed; and the coil current "i" is then calculated. This is the only difference between the above-described second embodiment and the third embodiment described hereinbelow. The following thus describes only the difference, in which redundant description is omitted.

Figure 14:
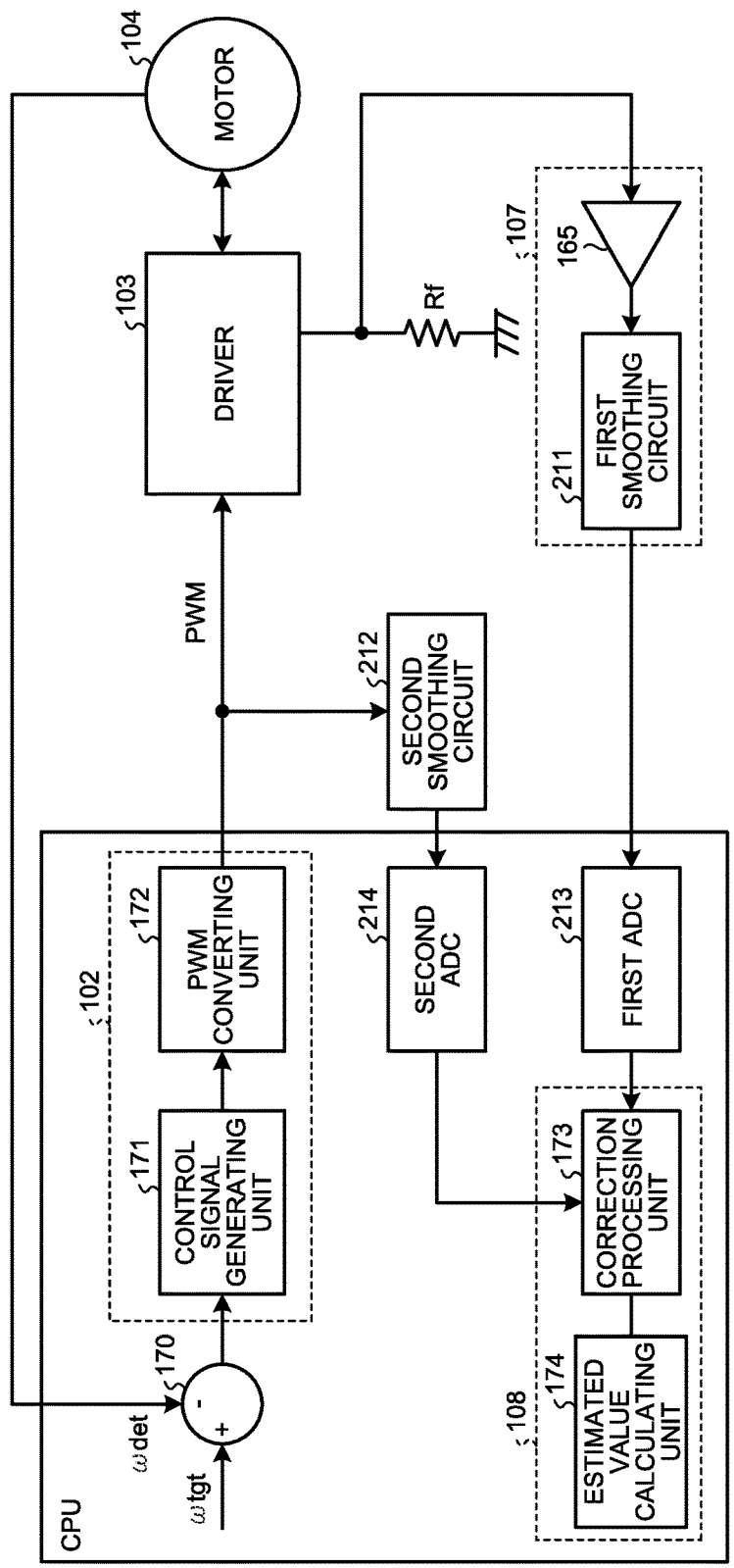
FIG. 14 is a diagram illustrating the configuration of the main part of a multifunction peripheral according to a third embodiment.

FIG. 14 illustrates the configuration of the main part of the multifunction peripheral according to the third embodiment. As illustrated in FIG. 14, the multifunction peripheral according to the third embodiment includes: a first smoothing circuit 211 provided in the current detecting circuit 107 and configured perform smoothing processing on the voltage across the shunt resistor to average the voltage across the shunt resistor: and a first ADC 213 configured to digitalize the voltage across the shunt resistor that has been smoothed and averaged by the first smoothing circuit 211 and supplies the digitalized voltage across the shunt resistor to the correction processing unit 173. The multifunction peripheral according to the third embodiment further includes: a second smoothing circuit 212 (an example of an averaging unit) that performs smoothing processing on and averages the control signal (Vctl) converted into a signal form of a pulse width modulation signal (PWM signal); and a second ADC 214 that digitalizes the control signal (Vctl) averaged by the second smoothing circuit 212 and supplies the control signal (Vctl) to the correction processing unit 173.

The correction processing unit 173 uses: "a" denoting the amplification factor of the non-inverting amplifier circuit 165 in the current detecting circuit 107; "V2" denoting the average of the voltage across the shunt resistor digitalized by the first ADC 211; "Vh" denoting the average of a control signal (Vctl) digitalized by the second ADC 212 and converted into a signal form of a pulse width modulation signal (PWM signal); and "Vp" denoting the value of the control signal (Vctl) converted into a signal form of a pulse width modulation signal (PWM signal). The correction processing unit 173 performs an arithmetic operation of "i=(V2/a)×(Vh/Vp)", thereby calculating the coil current "i" in the motor 104.

This configuration makes it possible to accurately correct the voltage across the shunt resistor and obtain accurate coil current with a simple configuration and inexpensively without a dedicated circuit provided for measuring the power supply voltage, and also makes it possible to provide the same effects as in the above-described first embodiment.

Fourth Embodiment

Next, a multifunction peripheral according to a fourth embodiment is described. The multifunction peripheral 1 according to the second embodiment is an example in which the correction processing unit 173 corrects the voltage across the shunt resistor using the pulse width of a control signal (Vctl) converted into a signal form of a pulse width modulation signal (PWM signal) and calculates the coil current "i". In contrast, the fourth embodiment is an example in which the coil current "i" is calculated while the voltage across the shunt resistor is corrected using the pulse width of the voltage across the shunt resistor. This is the only difference between the above-described second embodiment and the fourth embodiment described hereinbelow. The following thus describes only the difference, in which redundant description is omitted.

Figure 15:
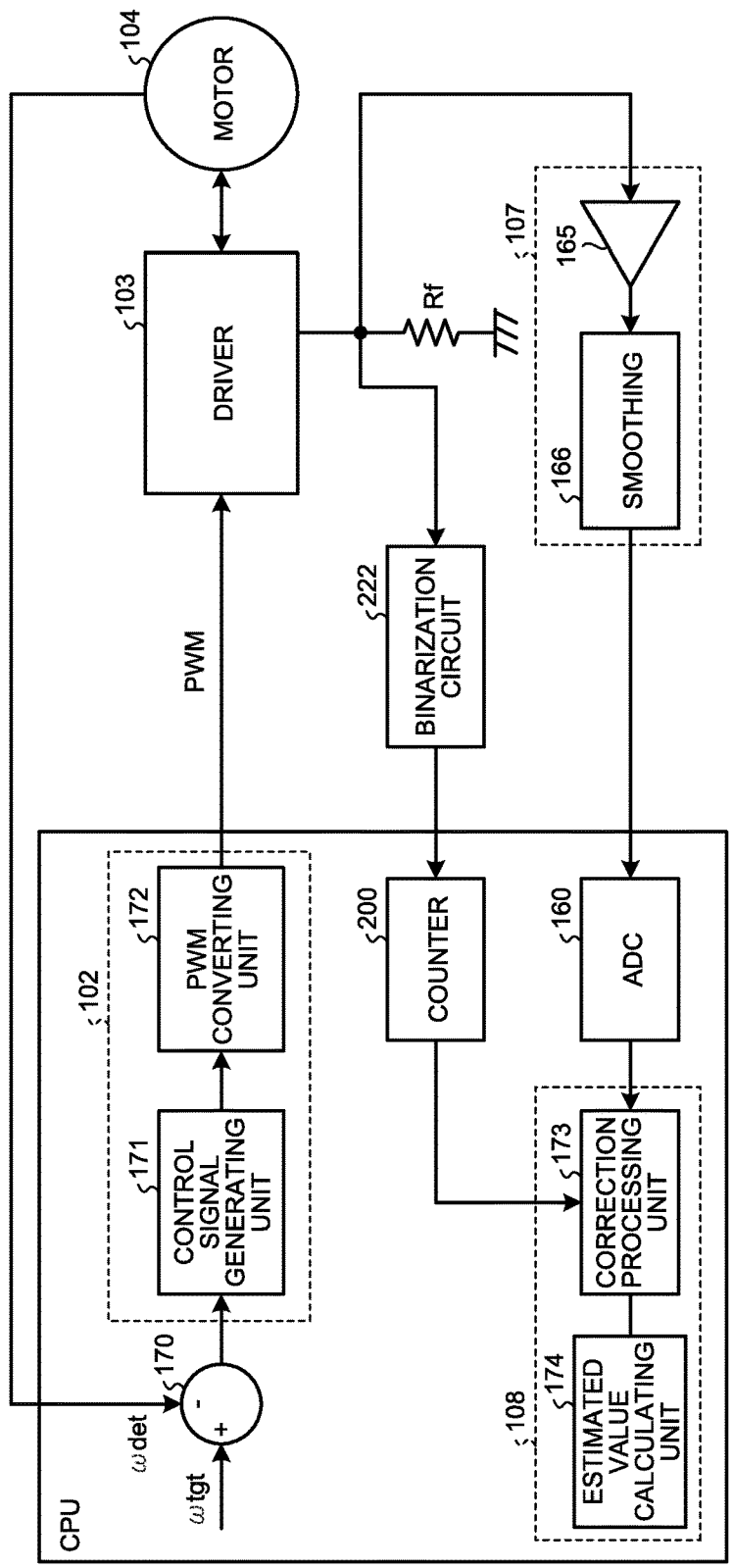
FIG. 15 is a diagram illustrating the configuration of the main part of a multifunction peripheral according to a fourth embodiment.

FIG. 15 illustrates the configuration of the main part of the multifunction peripheral according to the fourth embodiment. As illustrated in FIG. 15 here, the multifunction peripheral according to the fourth embodiment includes: a binarization circuit 222 that performs binarization processing on the voltage across the shunt resistor into high-level signals and low-level signals; and the counter 200 that counts a pulse width of the binarized voltage across the shunt resistor from the binarization circuit 222 and supplies the obtained count value to the correction processing unit 173. The binarization circuit 222 and the counter 200 are an example of a pulse width detecting unit.

The correction processing unit 173 performs correction processing on the value of the voltage across the shunt resistor supplied from the ADC 160, using the pulse width of the voltage across the shunt resistor that is the count value supplied from the counter 200. More specifically, the correction processing unit 173 uses: "a" denoting the amplification factor of the non-inverting amplifier circuit 165 in the current detecting circuit 107; "f" denoting the clock source frequency of the counter 200; "t" denoting the count value (=the pulse width) of the counter 200; "V2" denoting the value (=the output of the ADC 160) of a voltage across the shunt resistor; and "T" denoting the PWM period of the control signal (Vctl) converted into a signal form of a pulse width modulation signal (PWM signal). The correction processing unit 173 then performs an arithmetic operation of "i=(V2/a)×((t/f)/T)", thereby calculating the coil current "i" in the motor 104.

This configuration makes it possible to accurately correct the voltage across the shunt resistor and obtain accurate coil current with a simple configuration and inexpensively without a dedicated circuit provided for measuring the power supply voltage, and also makes it possible to provide the same effects as in the above-described first embodiment.

Fifth Embodiment

Next, a multifunction peripheral according to a fifth embodiment is described. This multifunction peripheral according to the fifth embodiment is an example in which the coil current "i" is calculated while voltage across the shunt resistor is corrected using a value obtained by smoothing and averaging pulse width of the voltage across the shunt resistor that has been obtained by binarizing the shunt register end-to-end voltages. This is the only difference between each of the above-described embodiments and the fifth embodiment described hereinbelow. The following thus describes only the difference, in which redundant description is omitted.

Figure 16:
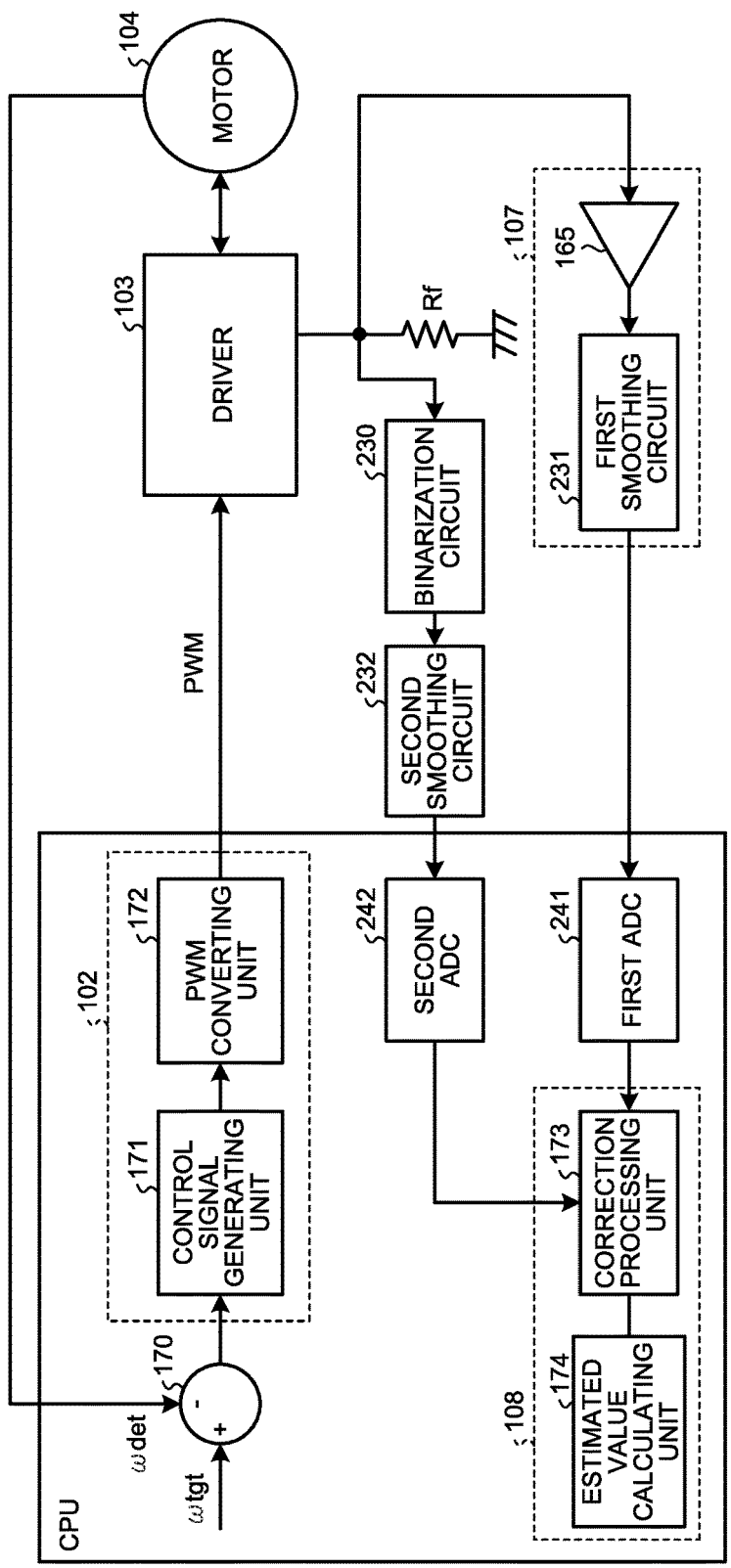
FIG. 16 is a diagram illustrating the configuration of the main part of a multifunction peripheral according to a fifth embodiment.

FIG. 16 illustrates the configuration of the main part of the multifunction peripheral according to the fifth embodiment. As illustrated in FIG. 15 here, the multifunction peripheral according to the fifth embodiment includes: a first smoothing circuit 231 provided in the current detecting circuit 107 and configured to perform smoothing processing on the voltage across the shunt resistor average the voltage across the shunt resistor: and a first ADC 241 configured to digitalize the voltage across the shunt resistor that has been smoothed and averaged by the first smoothing circuit 211 and supplies the digitalized voltage across the shunt resistor to the correction processing unit 173. The multifunction peripheral according to the fifth embodiment further includes: a binarization circuit 230 that binarizes the voltage across the shunt resistor; a second smoothing circuit 232 that smoothes the value of the binarized voltage across the shunt resistor; and a second ADC 241 that digitalizes and averages the smoothed value of the voltage across the shunt resistor and supplies the value to the correction processing unit 173.

In the case of the multifunction peripheral described herein according to the fifth embodiment, the binarization circuit 230 binarizes the voltage across the shunt resistor. Furthermore, the second smoothing circuit 232 smoothes the value of the binarized voltage across the shunt resistor. The second ADC 242 digitalizes and thereby averages the smoothed voltage across the shunt resistor, and supplies these averaged voltages across the shunt resistor to the correction processing unit 173.

The correction processing unit 173 uses: "a" denoting the amplification factor of the non-inverting amplifier circuit 165 in the current detecting circuit 107; "V2" denoting the average of the voltage across the shunt resistor digitalized by the first ADC 241; "Vh" denoting the average of a control signal (Vctl) digitalized by the second ADC 242 and converted into a signal form of a pulse width modulation signal (PWM signal); and "Vp" denoting the value of the control signal (Vctl) converted into a signal form of a pulse width modulation signal (PWM signal). The correction processing unit 173 performs an arithmetic operation of "i=(V2/a)×(Vh/Vp)", thereby calculating the coil current "i" in the motor 104.

This configuration makes it possible to accurately correct the voltage across the shunt resistor and obtain accurate coil current with a simple configuration and inexpensively without a dedicated circuit provided for measuring the power supply voltage, and also makes it possible to provide the same effects as in the above-described first embodiment.

Finally, the above-described embodiments are each provided as an example, and are not intended to limit the scope of the present invention. These novel embodiments can be implemented in other various forms, and various omissions, replacements, and alterations can be made thereto without departing from the spirit of the invention.

Figure 17:
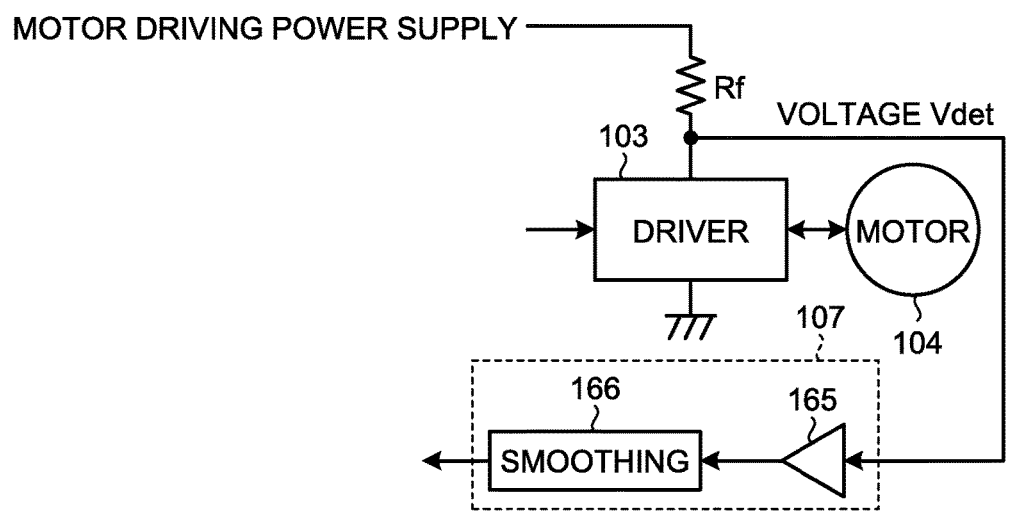
FIG. 17 is a diagram for explaining a modification of each of the embodiments when a shunt resistor is provided to the motor driving power supply side.

For example, although the shunt resistor Rf is provided to the ground side in each of the above-described embodiments as illustrated in FIG. 5 and FIG. 9, the shunt resistor Rf may be provided to the motor driving power supply side as illustrated in FIG. 17. In such a case, the same effects as in the respective above-described embodiments can be provided.

Furthermore, each of the embodiments is an example of application thereof to the multifunction peripheral 1, but may alternatively be applied to, for example, a motor that drives a conveyance roller in a conveyance apparatus that conveys sheets such as prepreg sheets, plastic sheets, or bank notes. Each of the embodiments may further alternatively be applied to a motor for rotationally driving a joint of an arm or the like in a robot. Each of the embodiments may further alternatively be applied to another apparatus such as a vehicle or an amusement apparatus. In any of such cases, the same effects as described above can be provided.

An embodiment provides the effect that unfavorable fluctuations, that are caused by fluctuations in the power supply voltage, in the value of the voltage across the shunt resistor detected with the single-shunt approach can be corrected with a simplified configuration.

The above-described embodiments are illustrative and do not limit the present invention. Thus, numerous additional modifications and variations are possible in light of the above teachings. For example, at least one element of different illustrative and exemplary embodiments herein may be combined with each other or substituted for each other within the scope of this disclosure and appended claims. Further, features of components of the embodiments, such as the number, the position, and the shape are not limited the embodiments and thus may be preferably set. It is therefore to be understood that within the scope of the appended claims, the disclosure of the present invention may be practiced otherwise than as specifically described herein.

The method steps, processes, or operations described herein are not to be construed as necessarily requiring their performance in the particular order discussed or illustrated, unless specifically identified as an order of performance or clearly identified through the context. It is also to be understood that additional or alternative steps may be employed.

Further, any of the above-described apparatus, devices or units can be implemented as a hardware apparatus, such as a special-purpose circuit or device, or as a hardware/software combination, such as a processor executing a software program.

Further, as described above, any one of the above-described and other methods of the present invention may be embodied in the form of a computer program stored in any kind of storage medium. Examples of storage mediums include, but are not limited to, flexible disk, hard disk, optical discs, magneto-optical discs, magnetic tapes, nonvolatile memory, semiconductor memory, read-only-memory (ROM), etc.

Alternatively, any one of the above-described and other methods of the present invention may be implemented by an application specific integrated circuit (ASIC), a digital signal processor (DSP) or a field programmable gate array (FPGA), prepared by interconnecting an appropriate network of conventional component circuits or by a combination thereof with one or more conventional general purpose microprocessors or signal processors programmed accordingly.

Each of the functions of the described embodiments may be implemented by one or more processing circuits or circuitry. Processing circuitry includes a programmed processor, as a processor includes circuitry. A processing circuit also includes devices such as an application specific integrated circuit (ASIC), digital signal processor (DSP), field programmable gate array (FPGA) and conventional circuit components arranged to perform the recited functions.

What is claimed is:
1. A current detecting device comprising:
a drive signal generator, configured to generate a control signal based on a control voltage value indicating drive force to be applied to a target;

a current detector, configured to detect a current value based on the control signal generated by the drive signal generator; and at least one processor, configured to correct the current value detected by the current detector, based on at least a magnitude of the control voltage value, wherein the current detector includes a shunt resistor, one end of the shunt resistor being connected to a power supply, configured to drive the target, and another end of the shunt resistor being connected to the drive signal generator.

2. The current detecting device according to claim 1, wherein the at least one processor is configured to correct the current value detected by the current detector, based on at least the magnitude of the control voltage value relative to a certain voltage value.

3. The current detecting device according to claim 1, wherein the control signal is a pulse width modulation signal.

4. The current detecting device according to claim 3, further comprising an averaging circuit configured to perform averaging processing on the control signal that is the pulse width modulation signal, the at least one processor being configured to correct the current value detected by the current detector, using the control signal on which the averaging processing has been performed.

5. The current detecting device according to claim 1, wherein the current detector includes a shunt resistor having one end connected to the drive signal generator and having the other end connected to the ground.

6. A motor controlling system comprising:
a motor that is the target; and
the current detecting device according to claim 1.

7. An image forming apparatus comprising:
at least one processor, configured to perform image processing; and
the current detecting device according to claim 1.

8. A sheet conveying device comprising:
a conveyor configured to convey a sheet; and
the motor controlling system according to claim 6,
the motor being configured to drive the conveyor configured to convey the sheet.

9. A robot comprising:
a rotary drive device; and
the motor controlling system according to claim 6,
the motor being configured to drive the rotary drive device.

10. A current detecting method comprising:
generating a control signal based on a control voltage value indicating drive force to be applied to a target;
detecting a current value based on the control signal generated at the generating; and
correcting the current value detected at the detecting, based on at least a magnitude of the control voltage value, wherein the detecting is performed by a current detector including a shunt resistor, one end of the shunt resistor being connected to a power supply, configured to apply the drive force to the target, and another end of the shunt resistor being connected to a drive signal generator generating the control signal.

11. The current detecting method according to claim 10, wherein at the correcting, the current value detected at the detecting is corrected based on at least the magnitude of the control voltage value relative to a certain voltage value.

12. The current detecting method according to claim 10, wherein the control signal is a pulse width modulation signal.

13. The current detecting method according to claim 12, further comprising performing averaging processing on the control signal that is the pulse width modulation signal, wherein at the correcting, the current value detected at the detecting is corrected using the control signal on which the averaging processing has been performed.

14. A sheet conveying device comprising:
a conveyor configured to convey a sheet; and
the motor controlling system according to claim 6, wherein the current detecting device is configured to correct the current value so that the motor is configured to accurately drive the conveyor to convey the sheet.

* * * * *